United States Patent
Holzapfel et al.

(10) Patent No.: US 9,151,593 B2
(45) Date of Patent: Oct. 6, 2015

(54) SYSTEM AND METHOD FOR POSITIONING A PROCESSING TOOL IN RELATION TO A WORKPIECE

(71) Applicant: DR. JOHANNES HEIDENHAIN GMBH, Traunreut (DE)

(72) Inventors: Wolfgang Holzapfel, Obing (DE); Joerg Drescher, Samerberg (DE); Markus Meissner, Uebersee (DE); Ralph Joerger, Traunstein (DE); Bernhard Musch, Otterfing (DE); Thomas Kaelberer, Schrobenhausen (DE)

(73) Assignee: DR. JOHANNES HEIDENHAIN GMBH, Traunreut (DE)

( * ) Notice: Subject to any disclaimer, the term of this patent is extended or adjusted under 35 U.S.C. 154(b) by 264 days.

(21) Appl. No.: 13/770,413

(22) Filed: Feb. 19, 2013

(65) Prior Publication Data
US 2013/0212854 A1    Aug. 22, 2013

Related U.S. Application Data

(60) Provisional application No. 61/600,342, filed on Feb. 17, 2012.

(30) Foreign Application Priority Data

Feb. 17, 2012  (DE) .......................... 10 2012 202 443

(51) Int. Cl.
*G01B 11/00* (2006.01)
*G01B 11/14* (2006.01)
*H01L 21/67* (2006.01)
*H01L 21/68* (2006.01)

(52) U.S. Cl.
CPC .............. *G01B 11/002* (2013.01); *G01B 11/14* (2013.01); *H01L 21/6715* (2013.01); *H01L 21/67138* (2013.01); *H01L 21/67144* (2013.01); *H01L 21/68* (2013.01); *H01L 21/681* (2013.01); *Y10T 29/49778* (2015.01); *Y10T 29/54* (2015.01)

(58) Field of Classification Search
None
See application file for complete search history.

(56) References Cited

U.S. PATENT DOCUMENTS

| 4,595,991 A | * | 6/1986 | Spies ................................ 33/12 |
| 4,631,404 A | * | 12/1986 | Burkhardt et al. ......... 250/237 G |
| 4,951,399 A | * | 8/1990 | Ernst ............................... 33/706 |

(Continued)

FOREIGN PATENT DOCUMENTS

DE    10 2007 023 300    11/2008

*Primary Examiner* — Gordon J Stock, Jr.
(74) *Attorney, Agent, or Firm* — Kenyon & Kenyon LLP

(57) ABSTRACT

In a system and a method for positioning a processing tool in relation to a workpiece, an object alignment mark and the workpiece are situated on a first object. In addition, a workpiece alignment mark is situated on the workpiece. The processing tool via which the object alignment mark is detectable is situated on a second object, which is disposed so as to be displaceable along at least one movement direction in relation to the first object. Furthermore, an alignment sensor is disposed thereon, with whose aid the object alignment mark and the workpiece alignment mark are detectable. In addition, a scannable measuring standard, which extends along the at least one movement direction, is disposed on the second object. At least two scanning units for scanning the measuring standard are situated on the first object in order to thereby determine the relative position between the first and the second object along the movement direction, the two scanning units having a defined offset.

7 Claims, 5 Drawing Sheets

(56) References Cited

U.S. PATENT DOCUMENTS

| | | |
|---|---|---|
| 7,796,272 B2 | 9/2010 | Holzapfel |
| 2009/0051895 A1* | 2/2009 | Shibazaki ................. 355/72 |
| 2009/0190110 A1* | 7/2009 | Shibazaki ................. 355/53 |
| 2010/0139836 A1 | 6/2010 | Horikoshi |
| 2010/0220183 A1 | 9/2010 | Yoro et al. |
| 2012/0293809 A1* | 11/2012 | Garczarek et al. ............ 356/614 |

* cited by examiner

SYSTEM AND METHOD FOR POSITIONING A PROCESSING TOOL IN RELATION TO A WORKPIECE

CROSS-REFERENCE TO RELATED APPLICATIONS

The present application claims the benefit of U.S. Provisional Patent Application No. 61/600,342, filed on Feb. 17, 2012, and claims priority to Application No. 10 2012 202 443.3, filed in the Federal Republic of Germany on Feb. 17, 2012, each of which is expressly incorporated herein in its entirety by reference thereto.

FIELD OF THE INVENTION

The present invention relates to a system and a method for positioning a processing tool in relation to a workpiece.

BACKGROUND INFORMATION

In machines employed in the production and/or checking of semiconductor components, for example, it is often necessary to accurately position a processing tool in relation to a workpiece. For instance, it may be necessary to position a workpiece in the form of a wafer underneath a processing tool in extremely precise manner A corresponding system is shown schematically in FIG. 1. The wafer, or workpiece WS, is situated on a first object O1 of the machine, which is a table. In addition, an object alignment mark $M_1$ is provided on first object O1. It may be arranged, for example, as a circular depression in the table or as lithographically produced microstructure on a plate fixed in place on the table. Moreover, a workpiece alignment mark $M_2$, which may be arranged as a locally restricted microstructure, for example, is provided on workpiece WS, or the wafer, mounted on first object O1.

A second object O2, i.e., a corresponding machine part, is provided in the machine such that it is able to move in at least one movement direction x in relation to first object O1. For example, the relative mobility between both objects O1, O2 may be ensured in that object O1, which is the table in the present example, is disposed in a manner that allows it move at least along movement direction x, whereas second object O2 is stationary.

A processing tool B and an alignment sensor W are provided on second object O2. Processing tool B is able to machine or inspect the workpiece during the production process.

Alignment sensor W is arranged as a microscope or camera equipped with an electronic image sensor, for example. Object alignment mark $M_1$ as well as workpiece alignment mark $M_2$ are detectable by alignment sensor W. That is to say, if the position of alignment sensor W along movement direction x matches the position of object alignment mark $M_1$ or of workpiece alignment mark $M_2$, then a corresponding alignment signal is able to be generated via alignment sensor W. The alignment signal may then be transmitted for further processing to a downstream control unit, which is not shown in FIG. 1.

Another alignment signal is furthermore able to be generated via an additional sensor system (not shown in FIG. 1) if the position of processing tool B along movement direction x matches the position of object alignment mark $M_1$. This may be done such that, for example, a microscope or a camera having an electronic image sensor is disposed on the side of object alignment mark $M_1$ as well. If processing tool B emits radiation, corresponding radiation detectors, which detect the radiation reflected, transmitted or dispersed by object alignment mark $M_1$, may be used as sensor system. Conversely, it is also possible that object alignment mark $M_1$ transmits radiation which is able to be detected by radiation detectors in processing tool B. To generate such an alignment signal, there is furthermore the alternative of detecting a mechanical contact between processing tool B and object alignment mark $M_1$ via an electrical contact current or suitable force sensors.

An optically scannable measuring standard S, for example, which extends along the at least one movement direction x, is provided on second object O2 so as to determine the relative position between first object O1 and second object O2. This measuring standard S may be arranged as a conventional reflected light diffraction grating, for example. To scan measuring standard S, a scanning unit E of an optical position measuring device is disposed on the side of first object O1. Scanning unit E may include, for example, a light source, a plurality of optical elements and a detector system so as to generate, with the aid of the detector system and in, e.g., a conventional manner, using an interferential scanning principle, exceedingly precise position signals regarding the relative position of the first and second object O1, O2, respectively, for the downstream control unit.

During the processing of the workpiece by processing tool B, it will now be necessary to determine the position of processing tool B relative to workpiece alignment mark $M_2$ in extremely precise manner. Since no position signals for the direct alignment of processing tool B in relation to workpiece alignment mark $M_2$ are able to be generated, this determination must take the form of a sequence of individual calibration steps.

For example, referencing of processing tool B in relation to first object O1 with the aid of alignment mark $M_1$ is required. Furthermore, referencing of alignment sensor W in relation to first object O1 must take place with the aid of object alignment mark $M_1$. Last but not least, referencing of alignment sensor W in relation to workpiece WS by workpiece alignment mark $M_2$ will be necessary.

In the different machine positions of these calibration steps and also during the subsequent actual machining, scanning unit E of the optical position measuring device scans regions of measuring standard S that have been provided with reference numerals $R_A$, $R_B$, $R_C$ and $R_D$ in FIG. 1. As illustrated, these regions lie on parts of scanned measuring standard S that are spaced relatively far apart along movement direction x. For example, the spacing of regions $R_C$ and $R_D$ corresponds roughly to the order of magnitude of the spacing $\vec{d}_{WB}$ between processing tool B and alignment sensor W inasmuch as the machining of workpiece WS by processing tool B takes place in the vicinity of workpiece alignment mark $M_2$. However, processing tool B is situated at a distance $\vec{d}_{WB}$ from alignment sensor W, with whose aid workpiece alignment mark $M_2$ is able to be detected in the aforementioned third step. When positioning processing tool B, measuring errors resulting from the deformation of sections of the measuring standard having an approximate length $\vec{d}_{WB}$ must therefore be expected.

FIG. 2 shows an exemplary illustration of existing long-wave deformations of an employed measuring standard S. Similar deviations furthermore are caused by errors in the machine guidance if measuring standard S is not aligned with processing tool B (Abbé error). FIG. 3 illustrates the position errors or measuring uncertainty $\Delta x_{rel}$ in the different machine positions according to the afore-discussed procedure when utilizing such a measuring standard S. As illustrated, corresponding measuring uncertainty $\Delta x_{rel}$ in the environment of relevant position $x_{rel}=0$ is considerable. $x_{rel}$ denotes the distance of the machining position from workpiece alignment mark $M_2$.

SUMMARY

Example embodiments of the present invention provide a system and a method for positioning a processing tool in relation to a workpiece, with the aid of which highly precise positioning of the processing tool is ensured and measuring errors resulting from faults of the utilized measuring standard are minimized or avoided, in particular.

According to an example embodiment of the present invention, a system for positioning a processing tool relative to a workpiece includes a first object on which an object alignment mark as well as the workpiece are disposed, a workpiece alignment mark being situated on the workpiece. In addition, the system includes a second object, which is disposed opposite the first object, such that it is able to be displaced along at least one movement direction. The processing tool via which the object alignment mark is detectable is situated on the second object. Moreover, an alignment sensor is disposed thereon, with whose aid the object alignment mark and the workpiece alignment mark are detectable. A scannable measuring standard, which extends along the at least one movement direction, is also disposed on the second object. At least two scanning units for scanning the measuring standard are situated on the first object, in order to thereby determine the relative position between the first and the second object along the movement direction, the two scanning units having a defined offset.

In this context, it is possible to select the offset between the two scanning units such that it is virtually identical to the distance between the processing tool and the alignment sensor.

In addition, it is possible to select the offset between the two scanning units such that it is identical to the distance between the processing tool and the alignment sensor.

The offset between the two scanning units may satisfy the condition:

$$|\vec{d}_E - \vec{d}_{WB}| << |\vec{d}_{WB}|$$

or the condition:

$$|\vec{d}_E - \vec{d}_{WB}| < 0.2 \cdot |\vec{d}_{WB}|,$$

in which $\vec{d}_E$ represents the offset between the two scanning units, and $\vec{d}_{WB}$ represents the distance between the processing tool and the alignment sensor.

It may optionally be provided that the scanning units are selectively activatable for determining the relative position between the first and the second object along the movement direction.

The object alignment mark and/or the workpiece alignment mark may be arranged as microstructures.

It is possible to arrange the measuring standard as linear graduation or as angular graduation or as two-dimensional grid graduation.

In a method for positioning a processing tool relative to a workpiece according to an example embodiment of the present invention, it is provided that an object alignment mark and the workpiece are disposed on a first object, and a workpiece alignment mark is situated on the workpiece. A second object is disposed opposite the first object in a manner allowing it to move along at least one movement direction. A processing tool via which the object alignment mark is detectable is situated on the second object. Moreover, an alignment sensor with whose aid the object alignment mark and the workpiece alignment mark are detected is disposed thereon. A scannable measuring standard, which extends along the at least one movement direction, is disposed on the second object in addition. At least two scanning units for scanning the measuring standard, via which the relative position between the first and the second object along the movement direction is determined, are situated on the first object, the two scanning units having a defined offset.

In this context, it is possible to select the offset between the two scanning units such a that it is virtually identical to the distance between the processing tool and the alignment sensor.

It may furthermore be provided that the offset between the two scanning units is selected to be identical to the distance between the processing tool and the alignment sensor.

The offset between the two scanning units may be selected according to the condition:

$$|\vec{d}_E - \vec{d}_{WB}| << |\vec{d}_{WB}|$$

or according to the condition:

$$|\vec{d}_E - \vec{d}_{WB}| < 0.2 \cdot |\vec{d}_{WB}|,$$

in which $\vec{d}_E$ represents the offset between the two scanning units, and $\vec{d}_{WB}$ represents the distance between the processing tool and the alignment sensor.

It may optionally be provided that only one of the two scanning units is activated for determining the relative position between the first and the second object.

The processing tool may approach the object alignment mark in one method step, and the relative position between the first and the second object detected by a first scanning unit is recorded in the process. In a further method step, the alignment sensor approaches the object alignment mark, and the relative position between the first and second object detected by a second scanning unit is recorded. In a further method step, the alignment sensor approaches the workpiece alignment mark, and the relative position between the first and second object detected by the second scanning unit is recorded in so doing. The sequence of the three different method steps is freely selectable.

In this variant, using the measurements of the previous three method steps, the positioning of the first object in relation to the second object is subsequently carried out during the machining of the workpiece by the processing tool in the region of the workpiece alignment mark.

A particular advantage of the approach described herein is that the accurate positioning of the processing tool in relation to the workpiece now no longer requires the scanning of a relatively large area of the measuring standard utilized for determining the position. Instead, the scanning by the at least two scanning units is limited to small, spatially narrowly delimited regions of the measuring standard. Only the inaccuracies of the measuring standard in these spatially restricted regions therefore affect the precision of the position determination. The extension of these regions substantially depends on the machined workpiece surface. Over all, this results in considerably fewer errors in the position determination and the relative positioning of the processing tool and the workpiece based thereon.

Depending on the accuracy requirements, complex calibrations of the employed measuring standard may thus be dispensed with. In addition, the thermal stabilization of the machine may be configured to be simpler since the measuring errors caused by thermal expansion are negligible within the small dimensions of the scanned regions of the measuring standard. The thermal expansion between the scanned regions no longer plays a role due to the use of the at least two spatially separated scanning units in the different method steps.

Further features and aspects of example embodiments of the present invention are described in more detail below with reference to the appended Figures.

DETAILED DESCRIPTION

Figure 1:
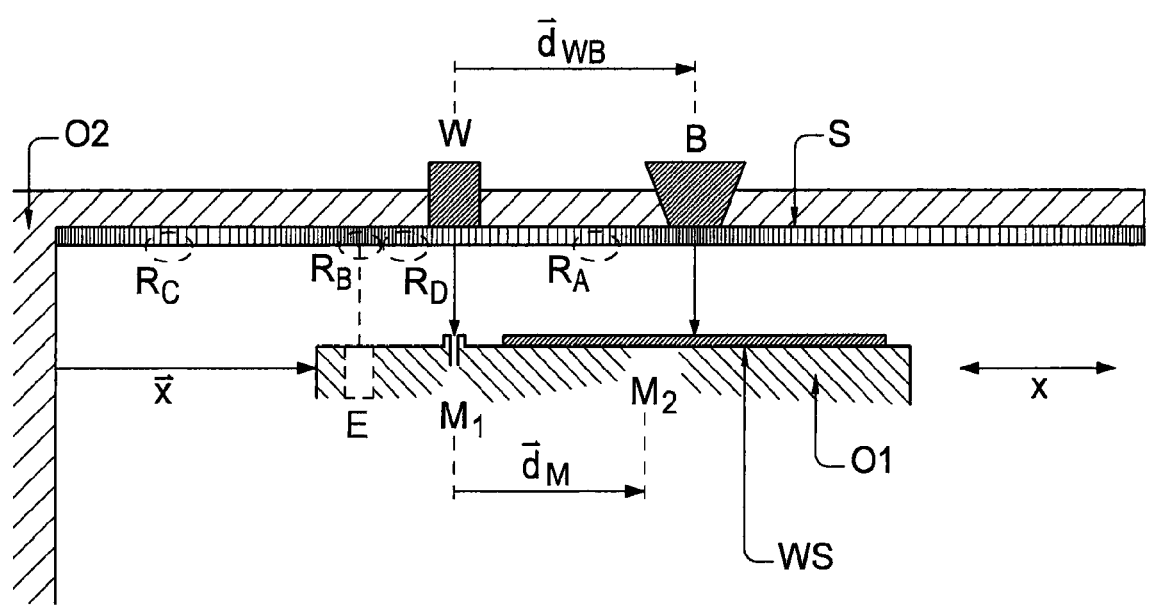
FIG. 1 schematically illustrates a conventional system.
Figure 4:
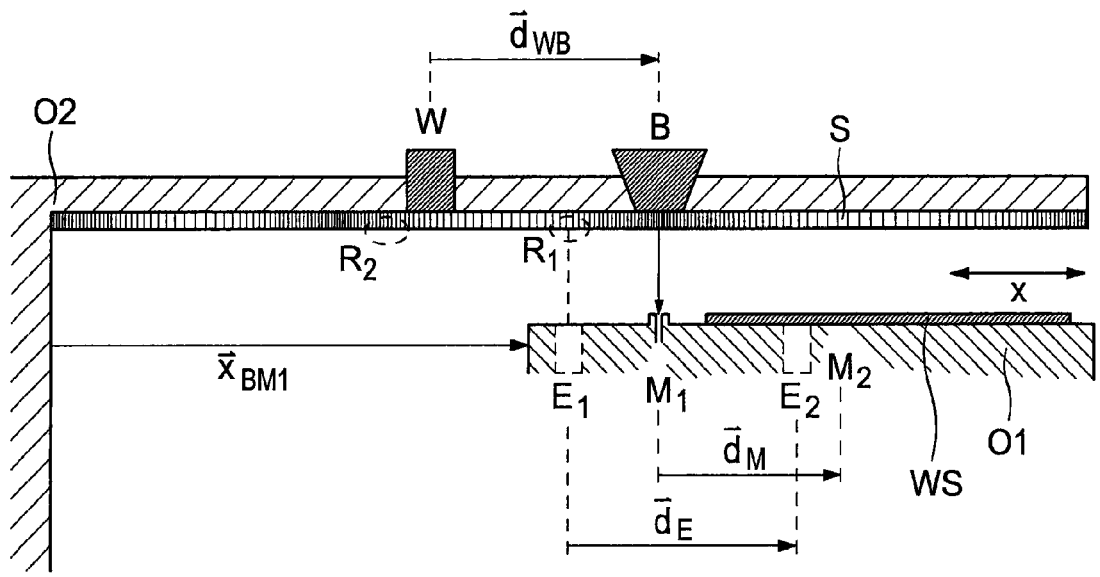
FIGS. 4 to 7 illustrate individual method steps using a system according to an example embodiment of the present invention.
Figure 5:
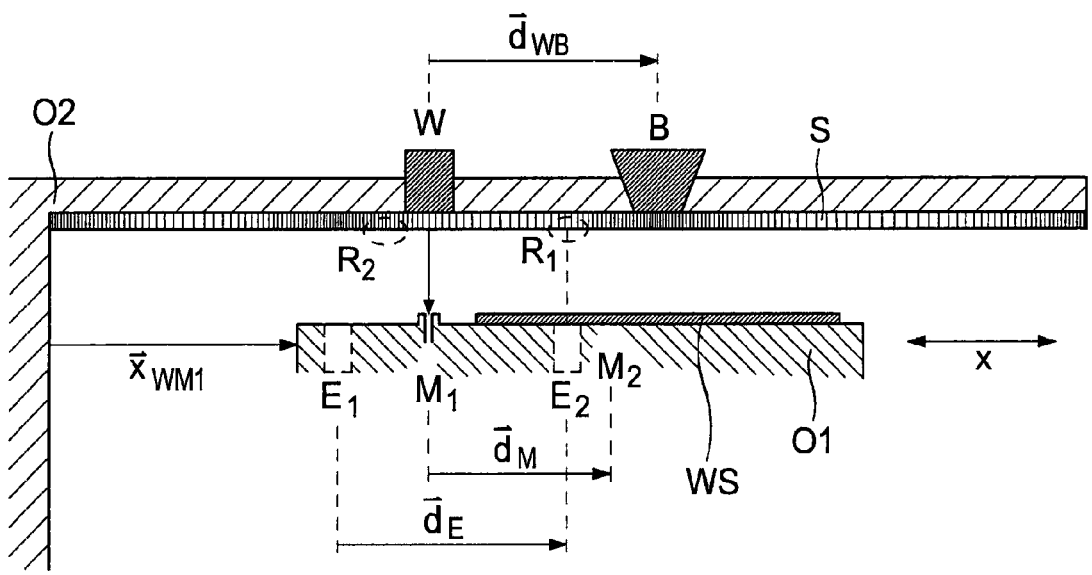
Figure 6:
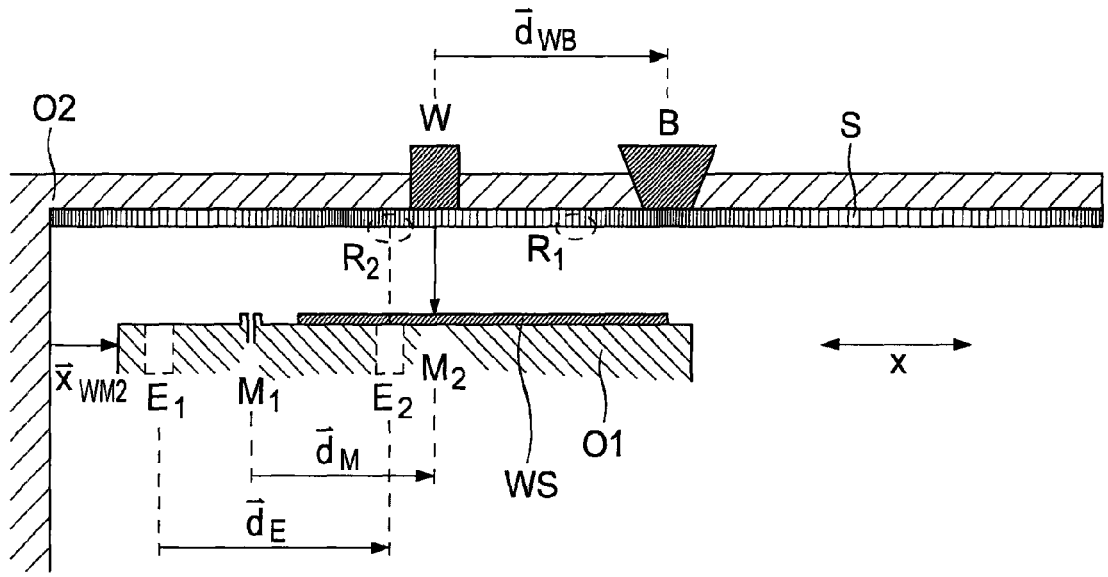
Figure 7:
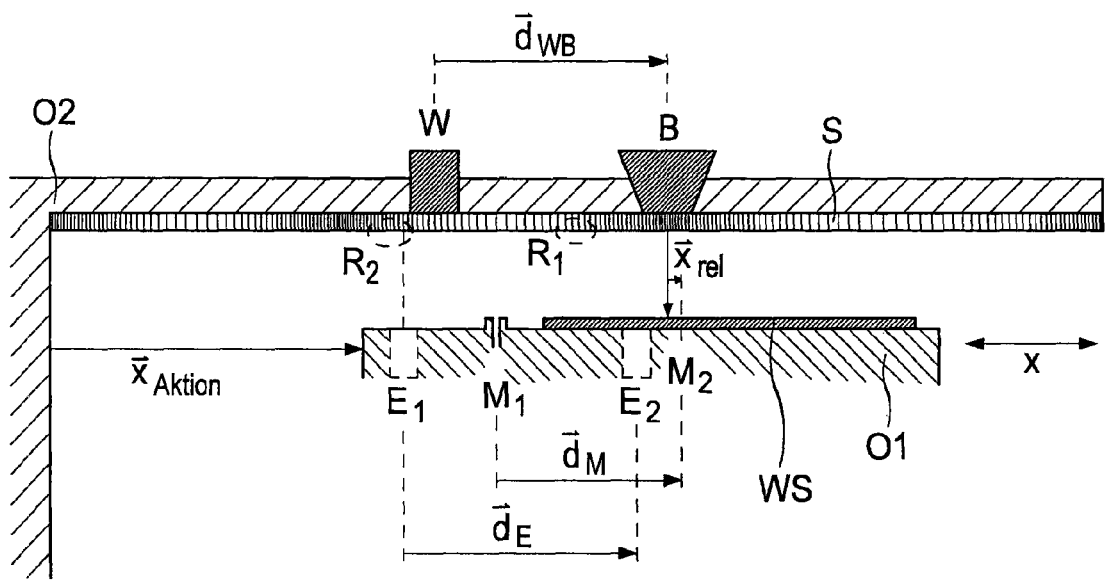

FIGS. 4 through 6 illustrate a system according to an example embodiment of the present invention in the different calibration or referencing steps mentioned above, which are performed for calibration purposes prior to the actual machining phase. FIG. 7 shows the particular phase during which the actual workpiece processing takes place. Unless a different meaning of the various reference numerals is explicitly mentioned in the following text, these reference numerals correspond to those of FIG. 1 described above. An exemplary embodiment of the system and the method is discussed below with reference to FIGS. 4 to 7.

According to example embodiments of the present invention, in contrast to the conventional system described above, at least two scanning units $E_1$, $E_2$ for scanning measuring standard S are arranged on first object O1, in order to thereby determine the relative position between first object O1 and second object O2 along movement direction x in an exceedingly precise manner. The exemplary embodiment illustrated provides for optical scanning of measuring standard S at a high resolution, such as via an interferential scanning principle. The two scanning units $E_1$, $E_2$ have a defined offset $\vec{d}_E$, as illustrated in FIGS. 4 to 7; in the exemplary embodiment shown, offset $\vec{d}_E$ extends along movement direction x. Offset $\vec{d}_E$ between the two scanning units $E_1$, $E_2$ is selected to be virtually identical to distance $\vec{d}_{WB}$ between processing tool B and alignment sensor W. It is possible that the distances are identical. Offset $\vec{d}_E$ between the two scanning units $E_1$, $E_2$ along movement direction x may satisfy the condition:

$$|\vec{d}_E - \vec{d}_{WB}| << |\vec{d}_{WB}| \qquad \text{(Eq. 1)}$$

in which $\vec{d}_E$ represents the offset between the two scanning units along the movement direction, and $\vec{d}_{WB}$ represents the distance between the processing tool and the alignment sensor along the movement direction. For example, the following condition may be satisfied:

$$|\vec{d}_E - \vec{d}_{WB}| < 0.2 \cdot |\vec{d}_{WB}| \qquad \text{(Eq. 1.1)}$$

Because at least two scanning units $E_1$, $E_2$ are employed at a defined offset $\vec{d}_E$ on first object O1, the measuring errors discussed above in the position determination caused by possibly existing deformations of scanned measuring standard S are able to be reduced to a considerable extent, as discussed in more detail below with reference to FIGS. 4 to 8.

A first calibration step V1 prior to the actual workpiece machining with the aid of the system is illustrated in FIG. 4. In the process, processing tool B approaches object alignment mark $M_1$, the relative position between first object O1 and second object O2 is detected by first scanning unit $E_1$ and recorded by the control unit. As indicated in FIG. 4 by the dash-dot connection between first scanning unit $E_1$ and measuring standard S, in this step first scanning unit $E_1$ scans a first region, denoted by $R_1$, of measuring standard S in order to determine a position.

A further calibration step V2 is shown in FIG. 5. Here, object alignment mark $M_1$ is approached by alignment sensor W, the relative position between first object O1 and second object O2 is detected by second scanning unit $E_2$, and recorded by the control unit. In this phase, second scanning unit $E_2$ also scans the first region, denoted by $R_1$, on measuring standard S, i.e., the same region as in the previous calibration step.

Third calibration step V3 utilizing the system is shown in FIG. 6. Alignment sensor W approaches workpiece alignment mark $M_2$, the relative position between first object O1 and second object O2 is detected by second scanning unit $E_2$ and recorded by the control unit. In this method step, as illustrated in FIG. 6, second scanning unit $E_2$, is used for scanning a second region $R_2$ on measuring standard S.

At this point, it should be mentioned that these three method steps V1 to V3 for the calibration prior to the actual workpiece machining need not necessarily be performed in the sequence described; instead, the method steps may be carried out in any other sequence as well.

FIG. 7 illustrates the workpiece machining that follows calibration steps V1 to V3. Processing tool B machines workpiece WS in the vicinity of workpiece alignment mark $M_2$. In this phase, as illustrated, the position is determined with the aid of first scanning unit $E_1$, which scans second region $R_2$ on measuring standard S.

Only one of the two scanning units $E_1$, $E_2$ is used for determining a position in the different method steps of this exemplary embodiment. In other words, the superposed control unit activates only one of the two scanning units $E_1$, $E_2$ in each instance. Scanning units $E_1$, $E_2$ thus are designed to be actuated in selective manner.

This description of the different method steps with the aid of the system hereof makes it clear that the scanning of utilized measuring standard S with the aid of the two scanning units $E_1$, $E_2$ is restricted to only two regions $R_1$, $R_2$ on measuring standard S, both during the calibration and during the actual workpiece machining. Furthermore, these two regions $R_1$, $R_2$ have only relatively small dimensions, with diameters that are smaller by orders of magnitude, for example, than the aforementioned distance in the graduation plane of measuring standard S. Since only relative position measurements which originate from the scanning of the two regions $R_1$, $R_2$ having small dimensions are therefore entered in the position determination during the machining operation according to FIG. 7, the initially mentioned errors caused by possible long-wave errors in measuring standard S are able to be minimized considerably. The measures described herein result in an optimized position determination in the machining process.

The reasons for achieving such an error minimization is explained below with reference to FIGS. 4 to 7.

The position of object O1, i.e., the table, on which processing tool B is situated above workpiece alignment mark $M_2$, is to be denoted by $\vec{x}_{BM2}$. The object positions in the three calibration method steps V1 to V3 and in processing method step V4 thus read:

$$V1: \vec{x}_{BM1} = \vec{x}_{BM2} + \vec{d}_M \quad \text{(Eq. 2.1)}$$

$$V2: \vec{x}_{WM1} = \vec{x}_{BM2} + \vec{d}_M - \vec{d}_{WB} \quad \text{(Eq. 2.2)}$$

$$V3: \vec{x}_{WM2} = \vec{x}_{BM2} - \vec{d}_{WB} \quad \text{(Eq. 2.3)}$$

$$V4: \vec{x}_{Aktion} = \vec{x}_{BM2} + \vec{x}_{rel} \quad \text{(Eq. 2.4)}$$

In this context, $\vec{x}_{rel}$ represents the searched for quantity, i.e., the offset of processing tool B in relation to workpiece alignment mark $M_2$ during the machining in table position $\vec{x}_{Aktion}$. For the sake of simplicity, a system made up of measuring standard S and scanning units $E_1$, $E_2$, with the aid of which only a single component of $\vec{x}_{rel}$ along a measuring direction $\vec{a}$ is able to be determined is discussed below. However, multiple components of $\vec{x}_{rel}$ are able to be determined in that systems of scanning units $E_1$, $E_2$ and measuring standards S having different measuring directions are combined with each other.

The output measured value $m_{E1}$ of scanning unit $E_1$ when reading measuring standard S at a particular location $\vec{x}$ is described as function:

$$m_{E1}(\vec{x}) := \vec{x} \cdot \vec{a} + u_S(\vec{x}) \quad \text{(Eq. 2.5),}$$

$u_S(\vec{x})$ representing an error term slowly variable with $\vec{x}$, which is caused by an uneven or deformed measuring standard S.

Measured value $m_{E2}(\vec{x})$ detected by scanning unit $E_2$ is represented accordingly as function:

$$m_{E2}(\vec{x}) := (\vec{x} + \vec{d}_E) \cdot \vec{a} + u_S(\vec{x} + \vec{d}_E), \quad \text{(Eq. 2.6).}$$

Measured values $m_1$-$m_4$ sampled in the four machine positions then result as follows:

$$m_1 = m_{E1}(\vec{x}_{BM1}) = (\vec{x}_{BM2} + \vec{d}_M) \cdot \vec{a} + u_S(\vec{x}_{BM2} + \vec{d}_M) \quad \text{(Eq. 2.7)}$$

$$m_2 = m_{E2}(\vec{x}_{WM1}) = (\vec{x}_{BM2} + \vec{d}_M - \vec{d}_{WB} + \vec{d}_E) \cdot \vec{a} + u_S(\vec{x}_{BM2} + \vec{d}_M - \vec{d}_{WB} + \vec{d}_E) \quad \text{(Eq. 2.8)}$$

$$m_3 = m_{E2}(\vec{x}_{WM2}) = (\vec{x}_{BM2} - \vec{d}_{WB} + \vec{d}_E) \cdot \vec{a} + u_S(\vec{x}_{BM2} - \vec{d}_{WB} + \vec{d}_E) \quad \text{(Eq. 2.9)}$$

$$m_4 = m_{E1}(\vec{x}_{Aktion}) = (\vec{x}_{BM2} + \vec{x}_{rel}) \cdot \vec{a} + u_S(\vec{x}_{BM2} + x_{rel}) \quad \text{(Eq. 2.10).}$$

The searched for quantity $\vec{x}_{rel} \cdot \vec{a}$, with the exception of the unknown error terms $u_S$, is obtained from a suitable linear combination of the measured values $m_1$ through $m_4$:

$$-m_1 + m_2 - m_3 + m_4 = \vec{x}_{rel} \cdot \vec{a}$$

$$-u_S(\vec{x}_{BM2} + \vec{d}_M) + u_S(\vec{x}_{BM2} + \vec{d}_M + \vec{\delta d})$$

$$-u_S(\vec{x}_{BM2} + \vec{\delta d}) + u_S(\vec{x}_{BM2} + \vec{x}_{rel}) \quad \text{(Eq. 2.11),}$$

$\vec{\delta d} := \vec{d}_E - \vec{d}_{WB}$ having been introduced.

It is assumed that $\vec{\delta \delta d}$ and $\vec{x}_{rel}$ are small compared to the order of magnitude of displacements at which significant changes of $u_S(\vec{x})$ are to be expected. Under this precondition, the error terms in the second and third line of Eq. 2.11 substantially cancel each other out, since measuring standard errors are produced at virtually the same position of measuring standard S with different algebraic signs. This applies irrespective of the measuring direction $\vec{a}$, and thus for all degrees of freedom of the relative movement of the two objects O1, O2 to be measured.

Figure 2:
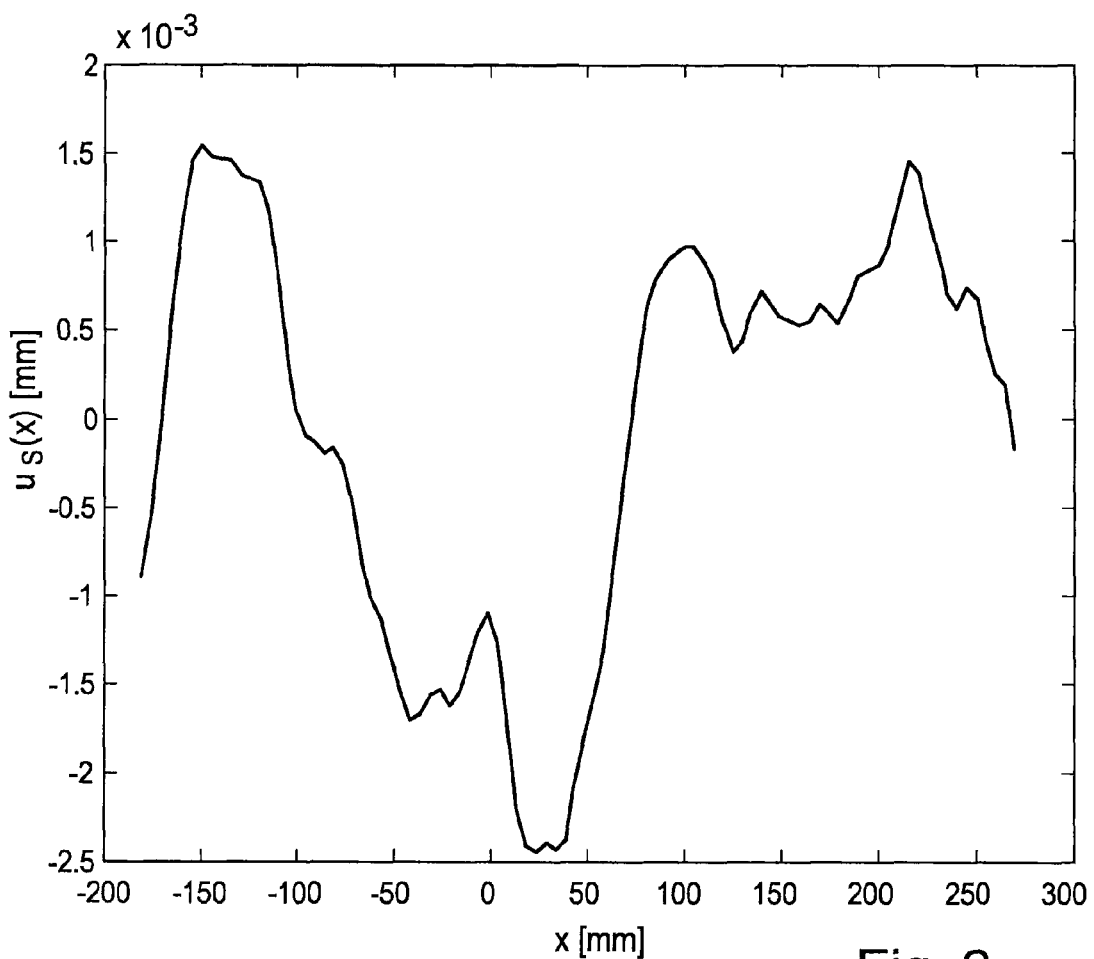
FIG. 2 schematically illustrates existing long-wave deformations of a measuring standard.
Figure 3:
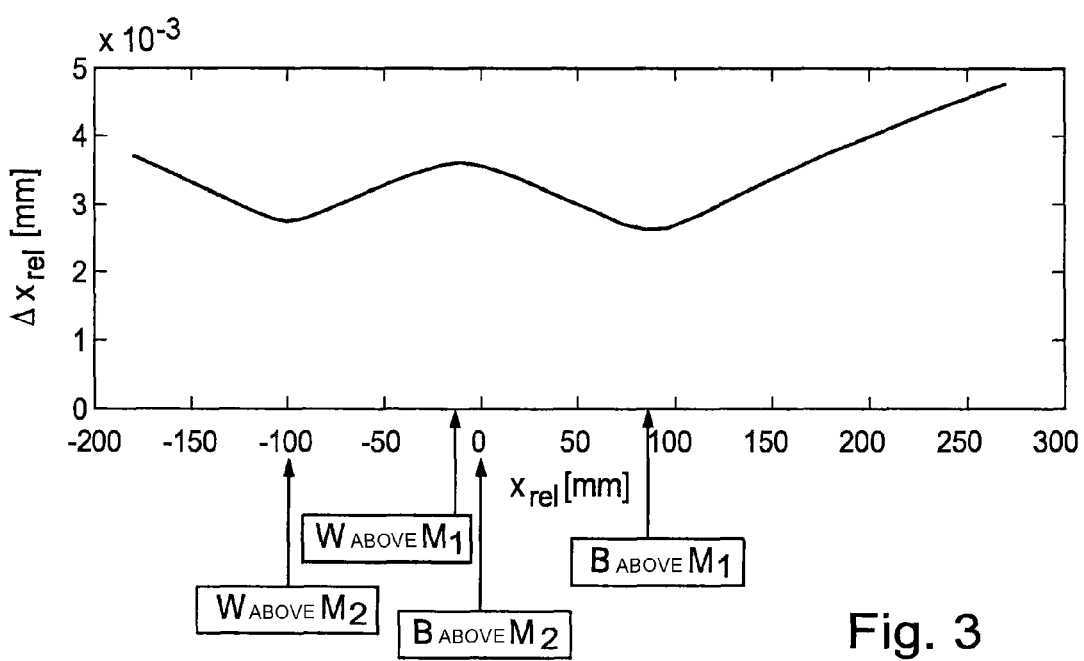
FIG. 3 schematically illustrates resulting position errors at different positions when proceeding conventionally.
Figure 8:
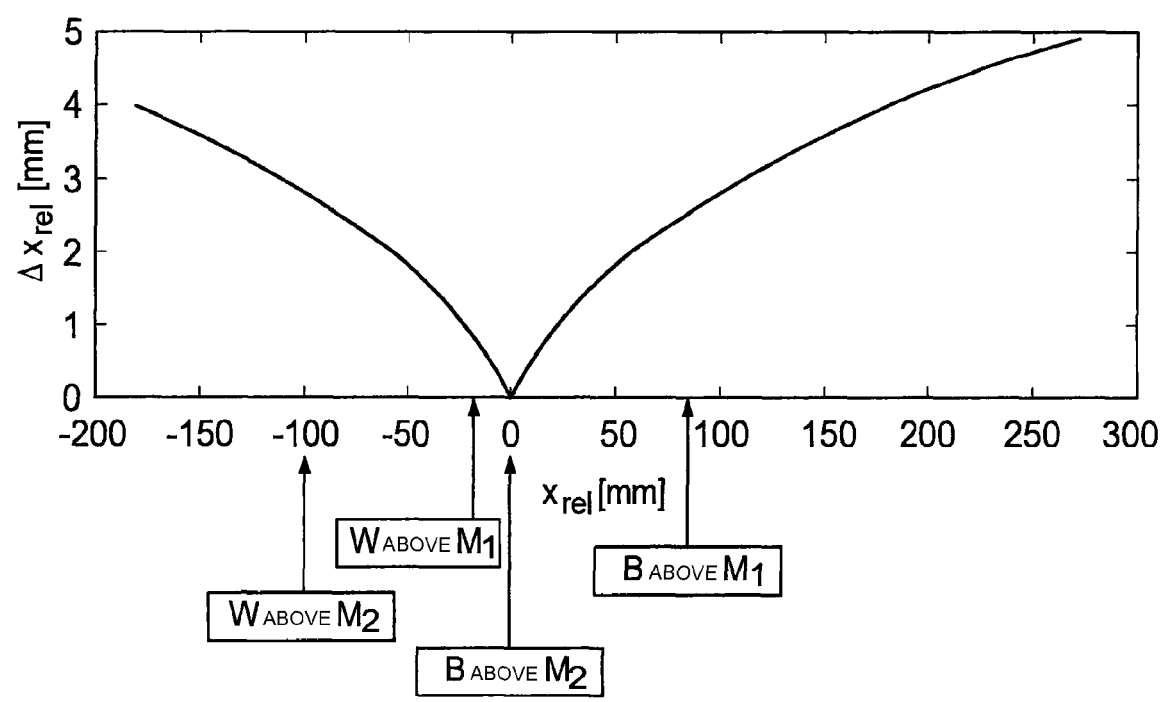
FIG. 8 illustrates resulting position errors at different positions when using a system according to an example embodiment of the present invention.

This examination makes it clear that, as a result of the measures described herein, the inaccuracy of measuring standard S ultimately plays a role in no more than relatively small, spatially restricted regions $R_1$, $R_2$. The size of these regions $R_1$, $R_2$ is substantially defined by the workpiece area to be machined around workpiece alignment mark $M_2$. Assuming an existing deformation of the measuring standard according to FIG. 2, FIG. 8, similar to the illustration of FIG. 3, shows the resulting position errors or measuring uncertainty $\Delta x_{rel}$ in the various machine positions, provided at least two scanning units are used in the manner described. As illustrated in FIG. 8, measuring inaccuracy $\Delta x_{rel}$ resulting from the deformation of the measuring standard drops back to zero at $\vec{x}_{rel} = 0$. It is then possible to position processing tool B in the environment of workpiece alignment mark $M_2$ with high precision.

As an alternative to a linear measuring standard, for example, a two-dimensional measuring standard that is arranged as cross-grating graduation may be used as well. Moreover, if the objects are rotatable in relation to each other, the measuring standard may also be arranged in the form of an angular graduation, which then is scanned by two scanning units that are spaced apart from each other. The angular distance of the two scanning units should then correspond approximately to the angular distance between the object alignment mark and the workpiece alignment mark.

As an alternative to optical scanning of the measuring standard, it is also possible to provide magnetic, capacitive or inductive scanning, given a corresponding configuration of the measuring standard and the scanning units.

Furthermore, a plurality of processing tools and/or alignment sensors may be provided in the system. In this configuration, a greater number of scanning units would be required as well. Under these circumstances, the appropriate scanning units for the individual method steps must be selected analogously to the afore-described procedure.

It is also possible to perform, prior to the described calibration steps, an additional measuring execution along the measuring region, using two active scanning units. The measured values of the two scanning units generated in the process are then set in relation to each other. In the subsequent method steps explained above, the resulting measured values may then be offset against the calibration data obtained during the previous measuring execution.

What is claimed is:

1. A system for positioning a processing tool in relation to a workpiece, a workpiece alignment mark being disposed on the workpiece, comprising:
    a first object, an object alignment mark and the workpiece being disposed on the first object;
    a second object displaceable along at least one movement direction relative to the first object, the processing tool adapted to machine and/or inspect the workpiece during a production process, and adapted to detect the object alignment mark, being disposed on the second object;
    an alignment sensor, adapted to detect the object alignment mark and the workpiece alignment mark, disposed on the second object;

a scannable measuring standard, extending along the at least one movement direction, disposed on the second object; and at least two scanner units, adapted to scan the measuring standard, disposed on the first object and adapted to determine a relative position between the first object and the second object along the movement direction, the two scanner units having a defined offset;

wherein the offset between the two scanner units satisfies:

$$|\vec{d}_E - \vec{d}_{WB}| < 0.2 \cdot |\vec{d}_{WB}|,$$

wherein $\vec{d}_E$ represents the offset between the two scanner units and $\vec{d}_{WB}$ represents a distance between the processing tool and the alignment sensor.

2. The system according to claim 1, wherein the offset between the two scanner units is substantially equal to a distance between the processing tool and the alignment sensor.

3. The system according to claim 1, wherein the offset between the two scanner units is equal to a distance between the processing tool and the alignment sensor.

4. The system according to claim 1, wherein the scanner units are selectively activatable to determine the relative position between the first object and the second object along the measuring direction.

5. The system according to claim 1, wherein the object alignment mark and/or the workpiece alignment mark includes a microstructure.

6. The system according to claim 1, wherein the measuring standard includes a linear graduation, an angular graduation, or a two-dimensional grid graduation.

7. A system, comprising:

a first object;

an object alignment mark disposed on the first object;

a workpiece disposed on the first object;

a workpiece alignment mark disposed on the workpiece;

a second object displaceable along at least one movement direction relative to the first object;

a processing tool positionable relative to the workpiece and disposed on the second object, the processing tool adapted to machine and/or inspect the workpiece during a production process, and adapted to detect the object alignment mark;

an alignment sensor disposed on the second object and adapted to detect the object alignment mark and the workpiece alignment mark;

a scannable measuring standard disposed on the second object and extending along the at least one movement direction; and at least two scanner units, adapted to scan the measuring standard, disposed on the first object, and adapted to determine a relative position between the first object and the second object along the movement direction, the two scanner units having a defined offset;

wherein the offset between the two scanner units satisfies:

$$|\vec{d}_E - \vec{d}_{WB}| < 0.2 \cdot |\vec{d}_{WB}|,$$

wherein $\vec{d}_E$ represents the offset between the two scanner units and $\vec{d}_{WB}$ represents a distance between the processing tool and the alignment sensor.

* * * * *